(12) United States Patent
Chong et al.

(10) Patent No.: US 6,912,437 B2
(45) Date of Patent: Jun. 28, 2005

(54) METHOD AND APPARATUS FOR CONTROLLING A FABRICATION PROCESS BASED ON A MEASURED ELECTRICAL CHARACTERISTIC

(75) Inventors: Robert J. Chong, Austin, TX (US); Jin Wang, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/262,620

(22) Filed: Sep. 30, 2002

(65) Prior Publication Data

US 2004/0093110 A1 May 13, 2004

(51) Int. Cl.⁷ .............................................. G06F 19/00
(52) U.S. Cl. ......................................... 700/121; 438/17
(58) Field of Search ........................... 700/121, 45, 31, 700/109, 110; 716/4; 438/14, 17–18

(56) References Cited

U.S. PATENT DOCUMENTS

| | | | | |
|---|---|---|---|---|
| 5,698,989 A | * | 12/1997 | Nulman | 324/719 |
| 5,905,384 A | * | 5/1999 | Inoue et al. | 324/769 |
| 5,935,877 A | * | 8/1999 | Autryve | 438/743 |
| 5,940,300 A | * | 8/1999 | Ozaki | 700/121 |
| 5,998,226 A | | 12/1999 | Chan | 438/10 |
| 6,041,270 A | * | 3/2000 | Steffan et al. | 700/121 |
| 6,284,622 B1 | * | 9/2001 | Campbell et al. | 438/424 |
| 6,298,470 B1 | * | 10/2001 | Breiner et al. | 716/4 |
| 6,505,090 B1 | | 1/2003 | Harakawa | 700/121 |
| 6,587,744 B1 | * | 7/2003 | Stoddard et al. | 700/121 |
| 2003/0049376 A1 | * | 3/2003 | Schwarm et al. | 427/255.28 |

FOREIGN PATENT DOCUMENTS

JP          2000182917 A       6/2000

OTHER PUBLICATIONS

International Search Report (PCT/US/03/29037) dated Jan. 15, 2004.
Turner, Timothy; "Electrical Measurement of IC Device DCS and Alignment" *Solid State Technology* Jun. 1998, pp. 115–118.
Ullán et al., "A Digital Test Structure For Simultaneous Birds's Beak Length And Misalignment Measurement In Polysilicon Emitter Bipolar Technologies" *IEEE 1997 Int. Conference on Microelectronic Test Structures*, vol. 10, pp. 25–30, Mar. 17, 1997.
Non–Destructive Detection Of Partial Metallization Fill In Via Interconnects *IBM Technical Disclosure Bulletin*, vol. 40, No. 01, p. 153, Jan. 1997.

\* cited by examiner

*Primary Examiner*—Leo Picard
*Assistant Examiner*—Alexander Kosowski
(74) *Attorney, Agent, or Firm*—Williams, Morgan & Amerson

(57) ABSTRACT

A method includes performing at least one process for forming a feature of a semiconductor device in accordance with an operating recipe. An electrical performance characteristic of the feature is measured. The measured electrical performance characteristic is compared to a target value for the electrical performance characteristic. At least one parameter of the operating recipe is determined based on the comparison. A system includes a process tool, a metrology tool, and a controller. The process tool is configured to perform at least one process for forming a feature of a semiconductor device in accordance with an operating recipe. The metrology tool is configured to measure an electrical performance characteristic of the feature. The controller is configured to compare the measured electrical performance characteristic to a target value for the electrical performance characteristic and determine at least one parameter of the operating recipe based on the comparison.

22 Claims, 6 Drawing Sheets

METHOD AND APPARATUS FOR CONTROLLING A FABRICATION PROCESS BASED ON A MEASURED ELECTRICAL CHARACTERISTIC

BACKGROUND OF THE INVENTION

1. Field of the Invention

This invention relates generally to the field of semiconductor device manufacturing and, more particularly, to a method and apparatus for controlling a fabrication process based on a measured electrical characteristic.

2. Description of the Related Art

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

Generally, a set of processing steps is performed on a lot of wafers using a variety of processing tools, including photolithography steppers, etch tools, deposition tools, polishing tools, rapid thermal processing tools, implantation tools, etc. The technologies underlying semiconductor processing tools have attracted increased attention over the last several years, resulting in substantial refinements. However, despite the advances made in this area, many of the processing tools that are currently commercially available suffer certain deficiencies. In particular, such tools often lack advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These deficiencies can engender non-optimal control of critical processing parameters, such as throughput, accuracy, stability and repeatability, processing temperatures, mechanical tool parameters, and the like. This variability manifests itself as within-run disparities, run-to-run disparities and tool-to-tool disparities that can propagate into deviations in product quality and performance, whereas an ideal monitoring and diagnostics system for such tools would provide a means of monitoring this variability, as well as providing means for optimizing control of critical parameters.

One technique for improving the operation of semiconductor processing line includes using a factory wide control system to automatically control the operation of the various processing tools. The manufacturing tools communicate with a manufacturing framework or a network of processing modules. Each manufacturing tool is generally connected to an equipment interface. The equipment interface is connected to a machine interface which facilitates communications between the manufacturing tool and the manufacturing framework. The machine interface can generally be part of an advanced process control (APC) system. The APC system initiates a control script based upon a manufacturing model, which can be a software program that automatically retrieves the data needed to execute a manufacturing process. Often, semiconductor devices are staged through multiple manufacturing tools for multiple processes, generating data relating to the quality of the processed semiconductor devices.

During the fabrication process various events may take place that affect the performance of the devices being fabricated. That is, variations in the fabrication process steps result in device performance variations. Factors, such as feature critical dimensions, doping levels, contact resistance, particle contamination, etc., all may potentially affect the end performance of the device. Various tools in the processing line are controlled in accordance with performance models to reduce processing variation. Commonly controlled tools include photolithography steppers, polishing tools, etching tools, and deposition tools. Pre-processing and/or post-processing metrology data is supplied to process controllers for the tools. Operating recipe parameters, such as processing time, are calculated by the process controllers based on the performance model and the metrology information to attempt to achieve post-processing results as close to a target value as possible. Reducing variation in this manner leads to increased throughput, reduced cost, higher device performance, etc., all of which equate to increased profitability.

Target values for the various processes performed are generally based on design values for the devices being fabricated. For example, a particular process layer may have a target thickness. Operating recipes for deposition tools and/or polishing tools may be automatically controlled to reduce variation about the target thickness. In another example, the critical dimensions of a transistor gate electrode may have an associated target value. The operating recipes of photolithography tools and/or etch tools may be automatically controlled to achieve the target critical dimensions.

In some cases, electrical measurements that determine the performance of the fabricated devices are not conducted until relatively late in the fabrication process, and sometimes not until the final test stage. This lag between the fabrication of the devices and the measurement of their performance characteristics makes it difficult to automatically control the fabrication processes to achieve the performance goals.

Typically, the electrical performance characteristics (e.g., speed, contact resistance, power consumption, etc.) of the devices manufactured are indirectly controlled by controlling the physical characteristics of the devices based on the design values determined for the dimensions and materials for the features. Variations in the actual device characteristics from the target values cause corresponding variation in the electrical performance characteristics. In some cases, a plurality of sources of variation may combine in an additive fashion to cause the electrical performance characteristics of the completed devices to be degraded or entirely unacceptable.

Typically, there may be more than one set of design or target values that can be used to achieve a particular electrical performance characteristic goal. However, because an indirect method of controlling the electrical performance characteristics is employed, the target values are typically static. In some situations, one or more of the fabrication processes may have difficulty reliably meeting its target. Various factors, such as tool cleanliness, age of consumable items, etc., can affect the performance and controllability of a tool. This variation from target deleteriously affects the electrical performance characteristics of the completed devices in a manner that is not readily accounted for by indirect control.

The present invention is directed to overcoming, or at least reducing the effects of, one or more of the problems set forth above.

SUMMARY OF THE INVENTION

One aspect of the present invention is seen in a method that includes performing at least one process for forming a feature of a semiconductor device in accordance with an operating recipe. An electrical performance characteristic of the feature is measured. The measured electrical performance characteristic is compared to a target value for the electrical performance characteristic. At least one parameter of the operating recipe is determined based on the comparison.

Another aspect of the present invention is seen in a system including a process tool, a metrology tool, and a controller. The process tool is configured to perform at least one process for forming a feature of a semiconductor device in accordance with an operating recipe. The metrology tool is configured to measure an electrical performance characteristic of the feature. The controller is configured to compare the measured electrical performance characteristic to a target value for the electrical performance characteristic and determine at least one parameter of the operating recipe based on the comparison.

BRIEF DESCRIPTION OF THE DRAWINGS

The invention may be understood by reference to the following description taken in conjunction with the accompanying drawings, in which like reference numerals identify like elements, and in which.

Figure 1:
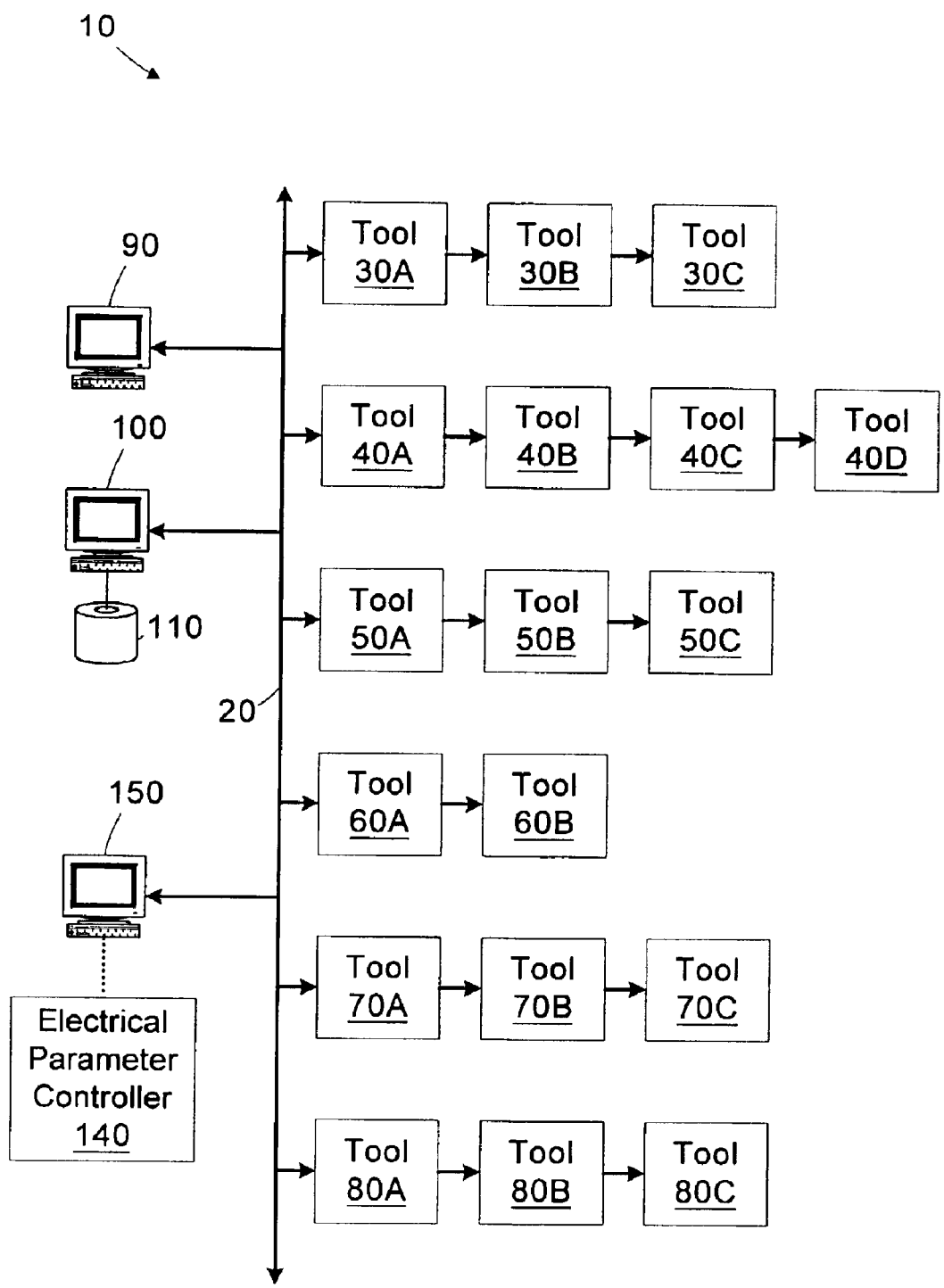
FIG. 1 is a simplified block diagram of a manufacturing system in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring to FIG. 1, a simplified block diagram of an illustrative manufacturing system 10 is provided. In the illustrated embodiment, the manufacturing system 10 is adapted to fabricate semiconductor devices. Although the invention is described as it may be implemented in a semiconductor fabrication facility, the invention is not so limited and may be applied to other manufacturing environments. The techniques described herein may be applied to a variety of workpieces or manufactured items, including, but not limited to, microprocessors, memory devices, digital signal processors, application specific integrated circuits (ASICs), or other similar devices. The techniques may also be applied to workpieces or manufactured items other than semiconductor devices.

A network 20 interconnects various components of the manufacturing system 10, allowing them to exchange information. The illustrative manufacturing system 10 includes a plurality of tools 30–80. Each of the tools 30–80 may be coupled to a computer (not shown) for interfacing with the network 20. The tools 30–80 are grouped into sets of like tools, as denoted by lettered suffixes. For example, the set of tools 30A–30C represent tools of a certain type, such as a chemical mechanical planarization tool. A particular wafer or lot of wafers progresses through the tools 30–80 as it is being manufactured, with each tool 30–80 performing a specific function in the process flow. Exemplary processing tools for a semiconductor device fabrication environment include metrology tools, photolithography steppers, etch tools, deposition tools, polishing tools, rapid thermal processing tools, implantation tools, etc. The tools 30–80 are illustrated in a rank and file grouping for illustrative purposes only. In an actual implementation, the tools 30–80 may be arranged in any physical order or grouping. Additionally, the connections between the tools in a particular grouping are meant to represent connections to the network 20, rather than interconnections between the tools 30–80.

A manufacturing execution system (MES) server 90 directs high level operation of the manufacturing system 10. The MES server 90 monitors the status of the various entities in the manufacturing system 10 (i.e., lots, tools 30–80) and controls the flow of articles of manufacture (e.g., lots of semiconductor wafers) through the process flow. A database server 100 is provided for storing data related to the status of the various entities and articles of manufacture in the process flow. The database server 100 may store information in one or more data stores 110. The data may include pre-process and post-process metrology data, tool states, lot priorities, etc.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary information exchange and process control framework suitable for use in the manufacturing system 10 is an Advanced Process Control (APC) framework, such as may be implemented using the Catalyst system offered by KLA-Tencor, Inc. The Catalyst system uses Semiconductor Equipment and Materials International (SEMI) Computer Integrated Manufacturing (CIM) Framework compliant system technologies and is based the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI, which is headquartered in Mountain View, Calif.

The processing and data storage functions are distributed amongst the different computers or workstations in FIG. 1 to provide general independence and central information storage. Of course, different numbers of computers and different arrangements may be used without departing from the spirit and scope of the instant invention.

The manufacturing system 10 also includes an electrical parameter controller 140 executing on a workstation 150. As described in greater detail below, the electrical parameter controller 140 receives feedback data regarding an electrical performance parameter of a fabricated device (e.g., from one of the tools 30–80 operating as a metrology tool) and determines one or more operating recipe parameters of one or more of the tools 30–80 operating as process tools. Exemplary measured electrical performance parameters may include contact resistance, line resistance, drive current, power consumption, etc. In general, the term electrical performance characteristic refers to an electrical measurement that indicates the performance of the feature. For purposes of illustration, the invention is described as it may be used to control a contact resistance parameter associated with a contact feature, however, the application of the invention is not so limited, as it may be applied to other electrical performance parameters. Although the various entities depicted in FIG. 1 are shown as being separate, one or more of them may be integrated into a single unit.

Figure 2:
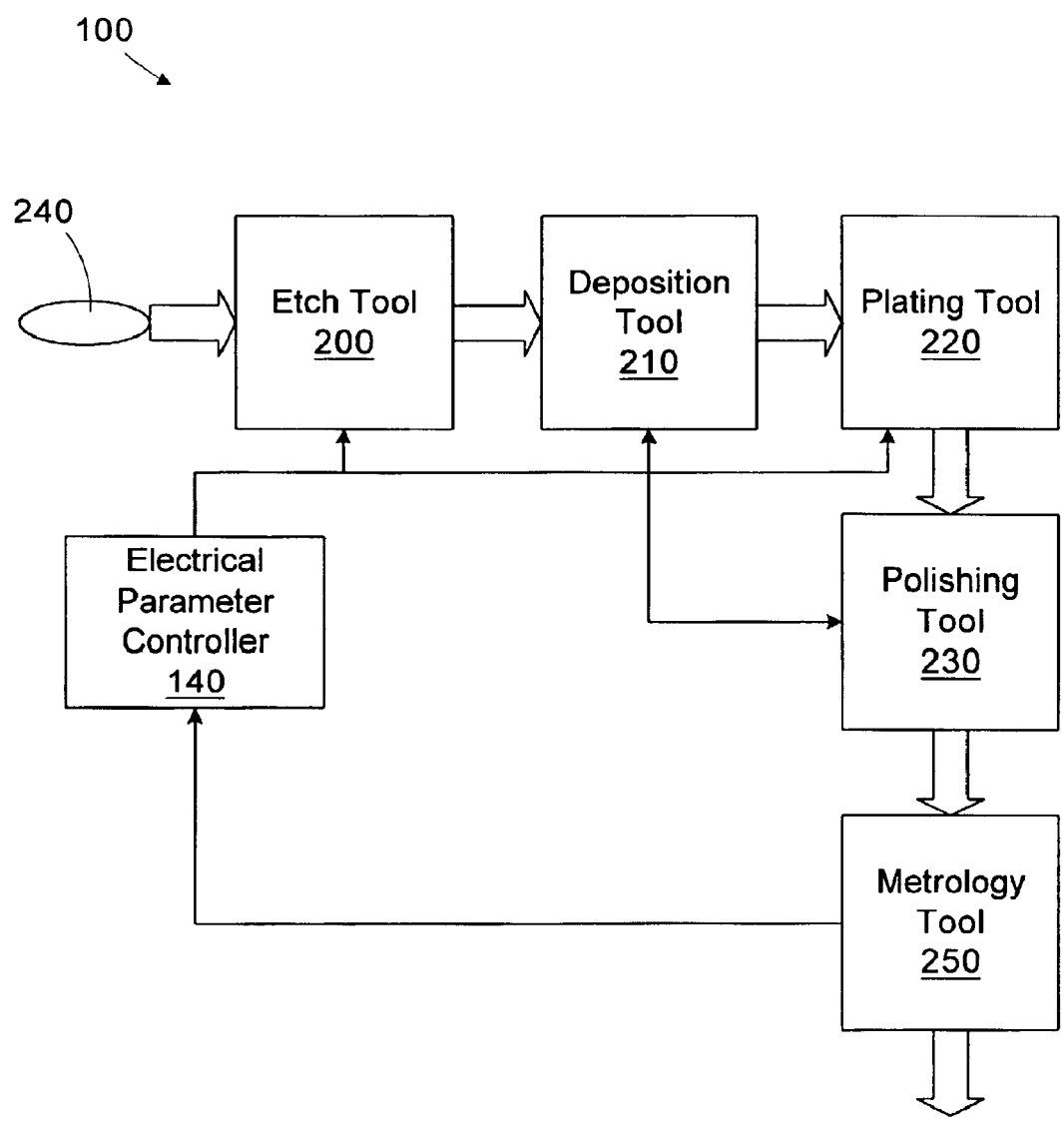
FIG. 2 is a simplified block diagram of a portion of the manufacturing system of FIG. 1.

Referring now to FIG. 2, a simplified block diagram of a portion of the manufacturing system 10 of FIG. 1 is provided. Process tools 200, 210, 220, 230 (e.g., selected form the tools 30–80) processes wafers 240 to form contact openings thereon. Each process tool 200, 210, 220, 230 implements an operating recipe. The functions of the tools 200, 210, 220, 230 in forming contacts are described in reference to FIGS. 3A through 3D.

Figure 3A:
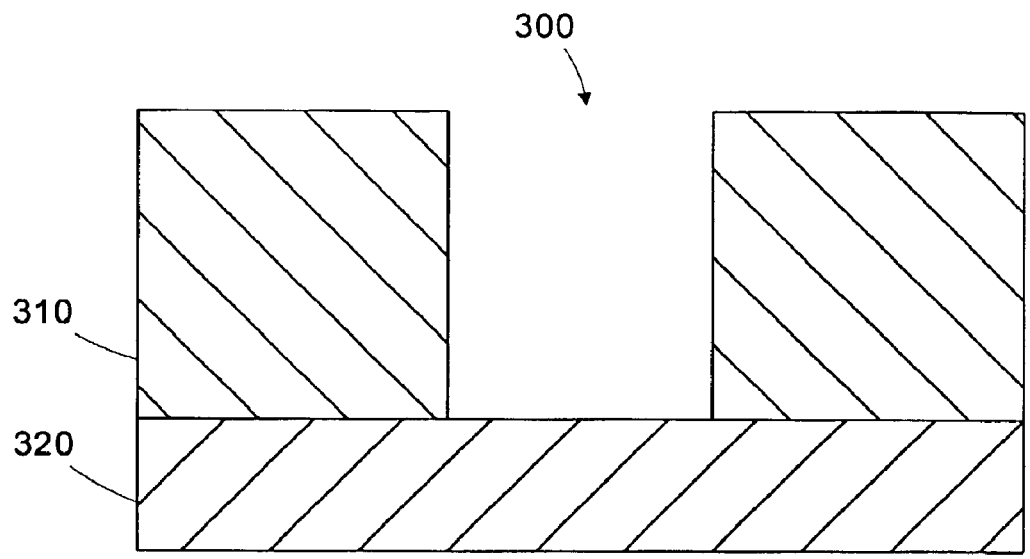
FIGS. 3A through 3D are cross section views of an illustrative device being manufactured by the manufacturing system of FIG. 1.

In the illustrated embodiment, the process tool 200 is an etch tool 200 configured to etch a contract opening 300 in an insulative layer 310 (e.g., TEOS, low-k dielectric) to contact an underlying conductive layer 320 (e.g., salicide, polysilicon), as shown in FIG. 3A. While the width of the contact opening 300 is typically governed by the width of the corresponding opening formed in a photoresist layer through which the contact opening is etched, the operating recipe parameters of the etch tool 200 (e.g., etch time, plasma power, pressure, gas concentration) do have an effect on the width of the contact opening 300. As the width of the contact opening increases, the contact resistance of the completed contact decreases.

Figure 3B:
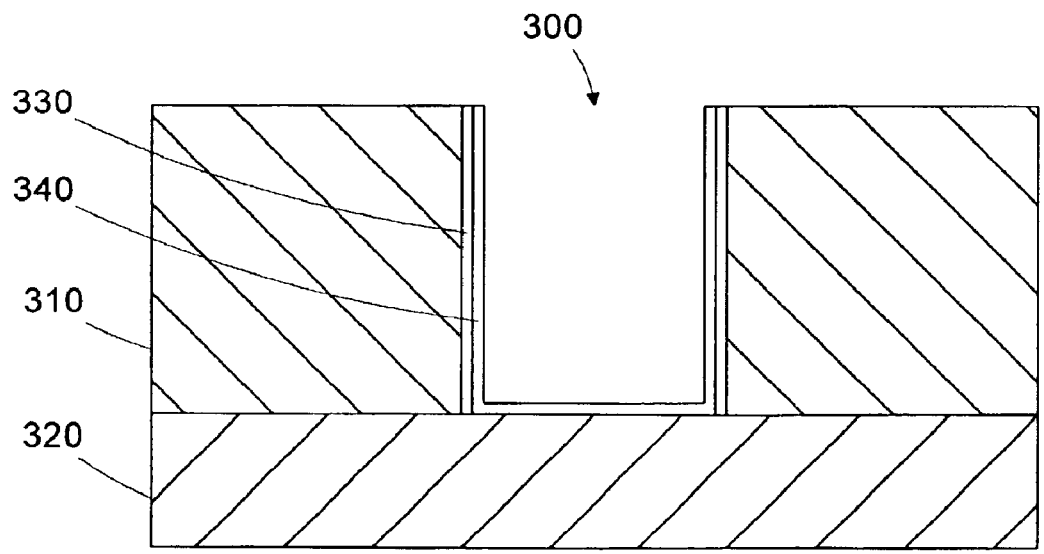

The process tool 210 is a deposition tool 210 configured to line the contact opening 300. As seen in FIG. 3B, the deposition tool 210 forms a barrier layer 330 (e.g., titanium, tantalum, tantalum nitride, titanium nitride, or some combination of these) to line the contact opening 300 and a seed layer 340 (e.g., copper for a copper fill or polysilicon for a tungsten fill) over the barrier layer 330. The barrier layer 330 helps to reduce electromigration of the material used to fill the contract opening 300 (e.g., copper) into the insulative layer 310. In the illustrated embodiment, the portion of the barrier layer 330 at the bottom of the contact opening 300 is removed (i.e., using other process steps not described) prior to forming the seed layer 340, although this feature may not be present in all embodiments. The seed layer 340 provides a base for a subsequent plating process to fill the contact opening. The particular makeup of the barrier and layers 340, and the ratio of the thicknesses of the components affect the contact resistance of the completed. For example, in a barrier layer 330 including titanium and titanium nitride reducing the thickness of the titanium nitride relative to that of the titanium (i.e., while maintaining a fixed combined thickness) reduces the contact resistance.

Figure 3C:
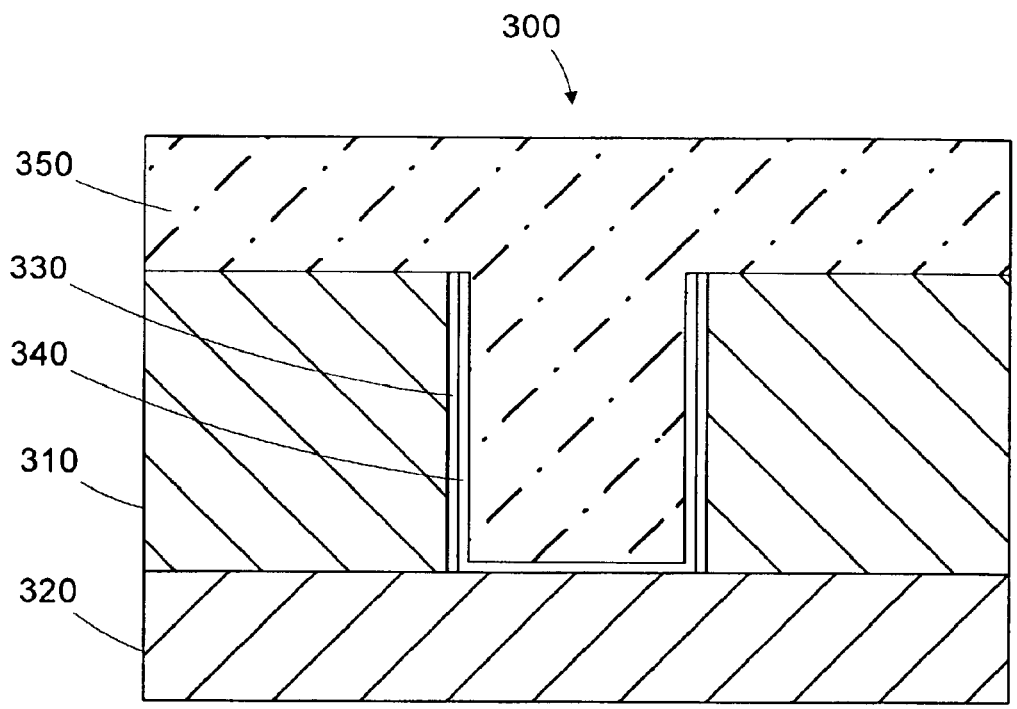

The process tool 220 is a plating tool 220 configured to fill (e.g., by electroplating or electroless plating) the contact opening with a conductive layer 350 (e.g., copper), as shown in FIG. 3C. Various plating parameters, such as temperature, solution concentrations, applied voltage, plating time, etc. affect the physical properties of the conductive layer (e.g., grain size), thereby affecting the contact resistance of the contact opening. Generally, a smaller grain size equates to reduced contact resistance.

Figure 3D:
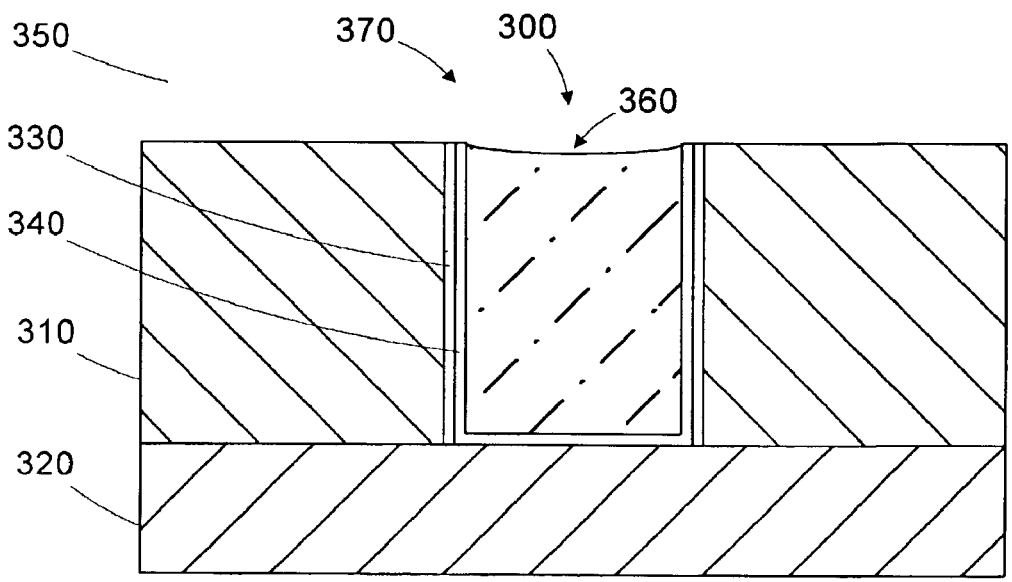

The process tool 230, is a polishing tool 230 configured to remove portions of the conductive layer 350 extending beyond the contact opening 300, as shown in FIG. 3D. Polishing parameters, such as polish time, downforce, polishing pad speed, polishing arm oscillation magnitude and frequency, slurry chemical composition, temperature, etc., effect the amount of material removed. If a portion 360 of the conductive layer 350 within the contact opening 300 is removed (i.e., a phenomenon referred to as dishing), the contact resistance is increased.

The manufacturing system 10 further includes a metrology tool 250 configured to measure an electrical performance parameter of a feature formed on the wafer 240. In the illustrated embodiment, the metrology tool 250 is configured to measure the contact resistance of the completed contact 370 (shown in FIG. 3D). The metrology tool 250 provides the measured electrical performance parameter (e.g. contact resistance) to the electrical parameter controller 140. As described above, various operating recipe parameters may affect the contact resistance of the completed contact 370. The electrical parameter controller 140 interfaces with one or more of the process tools 200–230 to determine one or more of the operating recipe parameters based on the measured feedback.

The electrical parameter controller 140 may use a control model of the controlled process tool(s) 200–230 to determine the operating recipe parameter(s). The control model may be developed empirically using commonly known linear or non-linear techniques. The control model may be a relatively simple equation based model (e.g., linear, exponential, weighted average, etc.) or a more complex model, such as a state space model, a finite impulse response (FIR) model, a neural network model, a principal component analysis (PCA) model, or a projection to latent structures (PLS) model. The specific implementation of the model may vary depending on the modeling technique selected. Using the control model, the electrical parameter controller 140 may determine operating recipe parameters to reduce variations in the contact resistance of the completed contacts 370 by comparing the measured electrical performance parameter to a target value for the electrical performance parameter. The particular control scenario depends on the particular type of process tool 30–80 being controlled.

The feedback data collected by the metrology tool 250 may be used to update the control model(s) employed by the electrical parameter controller 140. Other feedback data collected by other metrology tools (not shown) regarding the physical characteristics of the contacts 370 (e.g., contact opening width, grain size, planarity, etc.) may also be used to update the control model.

Figure 4:
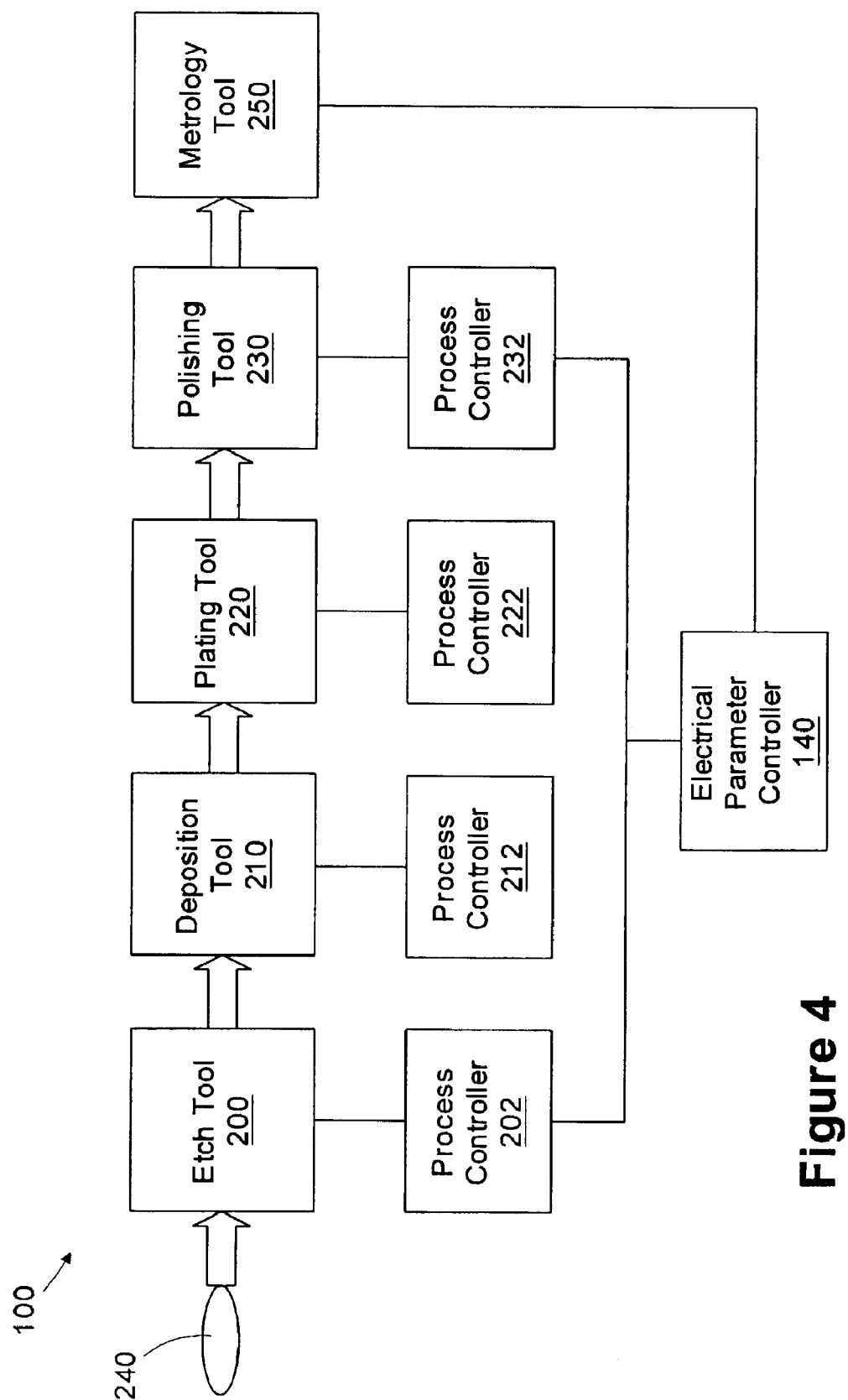
FIG. 4 is a simplified block diagram of an alternative embodiment of the portion of the manufacturing system of FIG. 2.

In another embodiment, shown in FIG. 4, the individual process tools 200–230 may have their own process controllers 202, 212, 222, 232 that control the operating recipe parameters based on feedback data collected regarding the physical characteristics of the contacts 370. The electrical parameter controller 140 may interface with these process controllers 202, 212, 222, 232 to influence the contact resistance at the contact level. Although the electrical parameter controller 140 and the process controllers 202, 212, 222, 232 are shown as separate entities, one or more of them may be combined into a single entity, depending on the particular implementation.

The process controllers 202, 212, 222, 232 may control their associated process tools 200, 210, 220, 230 based on their established base target values and collected feedback, and the electrical parameter controller 140 could coordinate its control actions with that of one of the process controllers 202, 212, 222, 232 based on the measured contact resistance feedback. For example, in one embodiment, the electrical parameter controller 140 may provide an offset to the base target value employed by the process controller 202, 212, 222, 232. In another embodiment, the electrical parameter controller 140 may provide an offset to the base operating recipe parameter determined by the process controller 202, 212, 222, 232.

For the operating parameter adjustment case, if the measured contact resistance were too high, the electrical parameter controller 140 could add an offset to the base etch time determined by the process controller 202 for the etch tool 200 to increase the size of the contact opening, further affecting a decrease in the contact resistance for subsequently. processed wafers 240.

In another implementation employing the target adjustment embodiment, the electrical parameter controller 140 could change the base target value for the width of the contact opening 300, and the process controller 202 would determine new operating recipe parameters to affect the change. Similar scenarios may be implemented for the other operating recipe parameters that affect the contact resistance (i.e., or other controlled electrical performance parameter) as described above for the various process tools 200, 210, 220, 230.

Exemplary electrical performance characteristics that may be controlled for a transistor device include polysilicon sheet resistance or gate voltage. The processes that may be controlled based on the electrical performance measurement feedback include implantation, etching to define gate width, silicide formation, deposition for gate stack layer thicknesses and makeup (e.g., polysilicon dopants).

Figure 5:
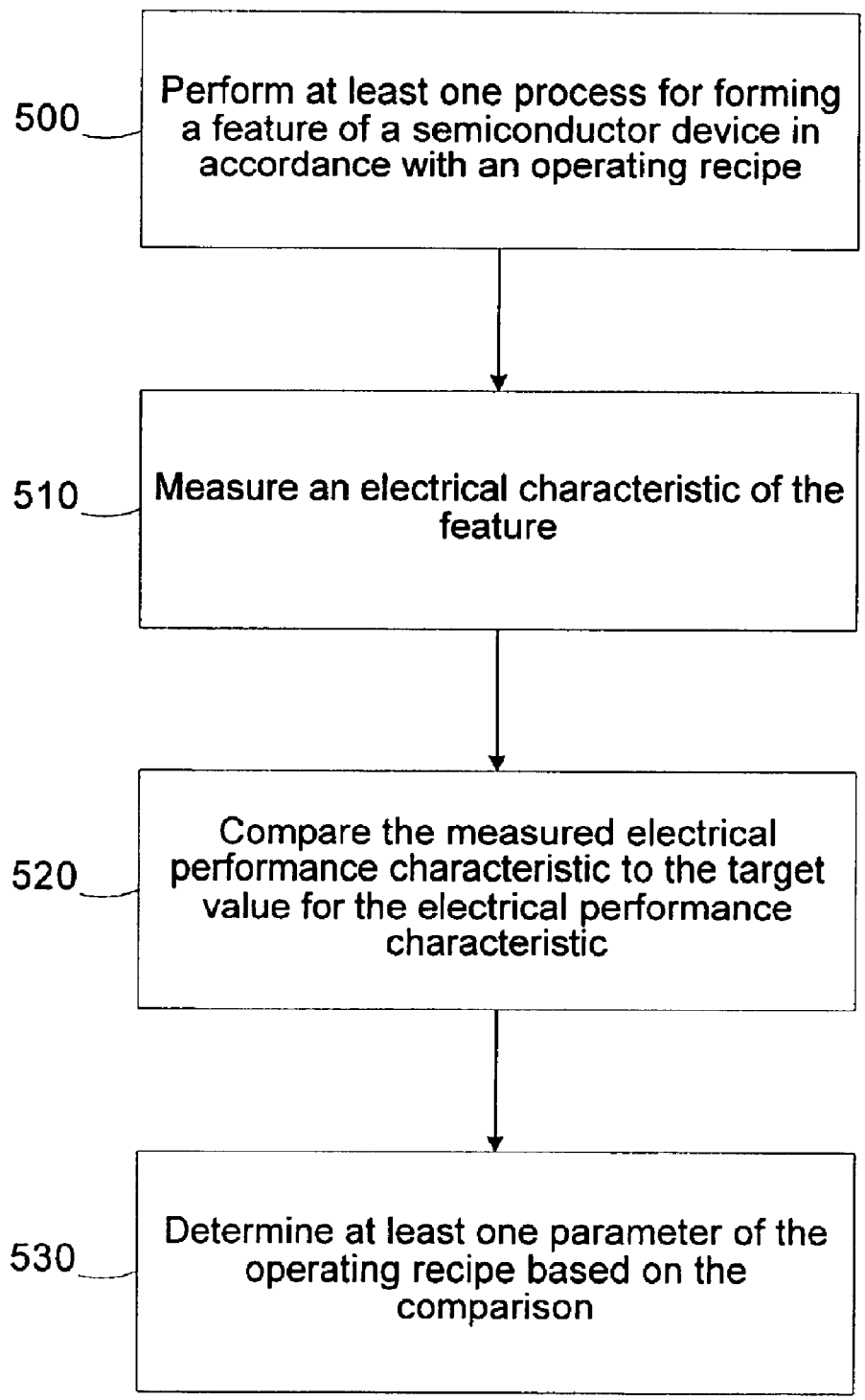
FIG. 5 is a simplified flow diagram of a method for controlling a fabrication process based on a measured electrical performance characteristic.

Turning now to FIG. 5, a simplified flow diagram of a method for controlling a fabrication process based on a measured electrical performance characteristic in accordance with another illustrative embodiment of the present invention is shown. In block 500, at least one process for forming a feature of a semiconductor device is performed in accordance with an operating recipe. In block 510, an electrical performance characteristic of the feature is measured. In block 520, the measured electrical performance characteristic is compared to a target value for the electrical performance characteristic. In block 530, at least one parameter of the operating recipe is determined based on the comparison.

Because the electrical parameter controller 140 interfaces with one or more of the process tools 200–230 used to form the contacts 370, it may control the process at the module level (i.e., the contact 370), as opposed to the feature level. In other words, the electrical parameter controller 140 directly controls the contact resistance. Variations introduced in the various processing steps may be accounted for without imposing a drift from the desired contact resistance values.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    performing at least one process for forming a feature of a semiconductor device in accordance with an operating recipe;
    measuring an electrical performance characteristic of the feature;
    comparing the measured electrical performance characteristic to a target value for the electrical performance characteristic; and
    determining at least one parameter of the operating recipe based on the comparison.

2. The method of claim 1, further comprising:
    performing a plurality of processes to form the feature, each process having an operating recipe; and
    determining at least one operating parameter of the operating recipes for a subset of the plurality of processes based on the comparison.

3. The method of claim 1, further comprising:
    determining a base value for the operating recipe parameter; and
    determining an offset to the base value based on the comparison.

4. The method of claim 1, wherein the process has a base target value associated with a physical characteristic of the feature, and the method further comprises:

determining an offset to the base target value based on the comparison; and determining the at least one parameter of the operating recipe based on the base target value and the offset.

5. The method of claim 1, wherein the feature comprises a contact, and measuring the electrical performance characteristic further comprises measuring a contact resistance parameter.

6. The method of claim 1, wherein the feature comprises a contact including a contact opening formed in an insulative layer in accordance with a first operating recipe, a first process layer lining the contact opening formed in accordance with a second operating recipe, a second process layer formed over the first process layer in accordance with a third operating recipe, and a conductive layer substantially filling the contact opening formed in accordance with a fourth operating recipe and polished to remove a portion of the conductive layer extending beyond the contact opening in accordance with a fifth operating recipe, and the method further comprises:

measuring a contact resistance of the contact as the electrical performance characteristic; and determining at least one parameter of at least one of the first, second, third, fourth and fifth operating recipes based on the comparison.

7. The method of claim 1, wherein the feature comprises a transistor, and measuring the electrical performance characteristic further comprises measuring a gate voltage parameter.

8. A method, comprising:

performing at least one etch process for forming a contact opening in an insulative layer of a semiconductor device in accordance with an operating recipe;

forming a contact in the contact opening in accordance with the operating recipe;

measuring a contact resistance parameter of the contact;

comparing the measured contact resistance parameter to the target value for the contact resistance parameter; and determining at least one of an etch time parameter, a plasma power parameter, a pressure parameter, and a gas concentration parameter of the operating recipe based on the comparison.

9. A method, comprising:

performing at least one process for forming a feature of a semiconductor device in accordance with an operating recipe, wherein the feature comprises a contact, and wherein performing the at least one process comprises performing at least one deposition process for forming a first process layer in a contact opening defined in an insulative layer and a second process layer over the first process layer in accordance with the operating recipe;

measuring a contact resistance parameter of the contact;

comparing the measured contact resistance parameter to the target value for the contact resistance parameter;

determining a ratio of thicknesses of the first and second process layers based on the comparison; and determining deposition times for the deposition process for the first and second process layers based on the determined ratio.

10. A method, comprising:

performing at least one process for forming a feature of a semiconductor device in accordance with an operating recipe, wherein the feature comprises a contact, and wherein performing the at least one process comprises performing at least one plating process for forming a conductive layer to substantially fill a contact opening defined in an insulative layer;

measuring a contact resistance parameter of the contact;

comparing the measured contact resistance parameter to the target value for the electrical performance characteristic; and determining at least one of a plating time parameter, a plating voltage parameter, an electrolyte concentration parameter, and a temperature parameter of the operating recipe based on the comparison.

11. A method, comprising:

performing at least one process for forming a feature of a semiconductor device in accordance with an operating recipe, wherein the feature comprises a contact, and wherein performing the at least one process comprises performing at least one polishing process for polishing a conductive layer filling and extending beyond a contact opening defined in an insulative layer;

measuring a contact resistance parameter of the contact;

comparing the measured contact resistance parameter to the target value for the contact resistance parameter; and determining at least one of a polishing time parameter, a downforce parameter, a polishing pad speed parameter, a polishing arm oscillation magnitude parameter, and a polishing arm oscillation frequency parameter, a slurry chemical composition parameter, and a temperature parameter of the operating recipe based on the comparison.

12. A system, comprising:

a process tool configured to perform at least one process for forming a feature of a semiconductor device in accordance with an operating recipe;

a metrology tool configured to measure an electrical performance characteristic of the feature; and a controller configured to compare the measured electrical performance characteristic to a target value for the electrical performance characteristic and determine at least one parameter of the operating recipe based on the comparison.

13. The system of claim 12, wherein the feature comprises a transistor and the electrical performance characteristic further comprises a gate voltage parameter.

14. The system of claim 12, further comprising a plurality of process tools configured to perform a plurality of processes to form the feature, each process tool having an operating recipe, wherein the controller is configured to determine at least one operating parameter of the operating recipes for a subset of the plurality of processes based on the comparison.

15. The system of claim 12, wherein the controller comprises a first controller and the system further comprises a second controller associated with the process tool and configured to determine a base value for the operating recipe parameter, and wherein the first controller is configured to determine an offset to the base value based on the comparison.

16. The system of claim 12, wherein the controller comprises a first controller and the system further comprises a second controller configured to control the process tool in accordance with a base target value associated with a physical characteristic of the feature, and the first controller is further configured to determine an offset to the base target value based on the comparison and the second controller is configured to determine the at least one parameter of the operating recipe based on the base target value and the offset.

17. The system of claim 12, wherein the feature comprises a contact, and the electrical performance characteristic further comprises a contact resistance parameter.

18. A system, comprising:
   an etch tool configured to etch a contact opening in an insulative layer of a semiconductor device in accordance with an operating recipe;
   a metrology tool configured to measure a contact resistance parameter of a contact formed in the contact opening; and
   a controller configured to compare the measured contact resistance parameter to a target value for the contact resistance parameter and determine at least one of an etch time parameter, a plasma power parameter, a pressure parameter, and a gas concentration parameter of the operating recipe based on the comparison.

19. A system, comprising:
   a deposition tool configured to forming a first process layer in a contact opening defined in an insulative layer and a second process layer over the first process layer of a semiconductor device in accordance with an operating recipe;
   a metrology tool configured to measure a contact resistance parameter of at least one of the first and second process layers; and
   a controller configured to compare the measured contact resistance parameter to a target value for the contact resistance parameter and determine a ratio of thicknesses of the first and second process layers based on the comparison and determine deposition times for the deposition process for the first and second process layers based on the determined ratio.

20. A system, comprising:
   a plating tool configured to form a conductive layer to substantially fill a contact opening defined in an insulative layer of a semiconductor device in accordance with an operating recipe;
   a metrology tool configured to measure a contact resistance parameter of the conductive layer; and
   a controller configured to compare the measured contact resistance parameter to a target value for the contact resistance parameter and determine at least one of a plating time parameter, a plating voltage parameter, an electrolyte concentration parameter, and a temperature parameter of the operating recipe based on the comparison.

21. A system, comprising:
   a polishing tool configured to polish a conductive layer filling and extending beyond a contact opening defined in an insulative layer of a semiconductor device in accordance with an operating recipe;
   a metrology tool configured to measure a contact resistance parameter of the conductive layer, and
   a controller configured to compare the measured contact resistance parameter to a target value for the contact resistance parameter and determine at least one of a polishing time parameter, a downforce parameter, a polishing pad speed parameter, a polishing arm oscillation magnitude parameter, and a polishing arm oscillation frequency parameter, a slurry chemical composition parameter, and a temperature parameter of the operating recipe based on the comparison.

22. A system, comprising:
   means for performing at least one process for forming a feature of a semiconductor device in accordance with an operating recipe;
   means for measuring an electrical performance characteristic of the feature;
   means for comparing the measured electrical performance characteristic to a target value for the electrical performance characteristic; and
   means for determining at least one parameter of the operating recipe based on the comparison.

* * * * *